United States Patent
Tong et al.

(10) Patent No.: US 11,146,038 B2
(45) Date of Patent: Oct. 12, 2021

(54) SEMICONDUCTOR LASER AND FABRICATION METHOD THEREOF

(71) Applicant: Changchun Institute of Optics, Fine Mechanics and Physics, Chinese Academy of Sciences, Jilin (CN)

(72) Inventors: Cunzhu Tong, Jilin (CN); Jiaxin Xu, Jilin (CN); Lijie Wang, Jilin (CN); Shili Shu, Jilin (CN); Sicong Tian, Jilin (CN); Xin Zhang, Jilin (CN); Lijun Wang, Jilin (CN)

(73) Assignee: Changchun Institute of Optics, Fine Mechanics and Physics, Chinese Academy of Sciences, Changchun (CN)

( * ) Notice: Subject to any disclaimer, the term of this patent is extended or adjusted under 35 U.S.C. 154(b) by 110 days.

(21) Appl. No.: 16/449,343

(22) Filed: Jun. 22, 2019

(65) Prior Publication Data
US 2020/0203924 A1    Jun. 25, 2020

(30) Foreign Application Priority Data
Dec. 25, 2018  (CN) .................. 201811593627.7

(51) Int. Cl.
| H01S 5/22  | (2006.01) |
| H01S 5/065 | (2006.01) |
| H01S 5/026 | (2006.01) |
| H01S 5/042 | (2006.01) |
| H01S 5/34  | (2006.01) |

(52) U.S. Cl.
CPC ............ *H01S 5/0653* (2013.01); *H01S 5/026* (2013.01); *H01S 5/0425* (2013.01); *H01S 5/22* (2013.01); *H01S 5/2202* (2013.01); *H01S 5/34* (2013.01)

(58) Field of Classification Search
CPC .... H01S 5/0653; H01S 5/0425; H01S 5/2202; H01S 5/026; H01S 5/22
See application file for complete search history.

(56) References Cited

U.S. PATENT DOCUMENTS

| 2012/0106583 A1* | 5/2012 | Watson ................. H01S 5/1231 |
| | | 372/46.012 |
| 2015/0280402 A1* | 10/2015 | Gubenko .................. H01S 5/12 |
| | | 372/50.11 |

FOREIGN PATENT DOCUMENTS

| CN | 104993375 A | 10/2015 |
| CN | 105428996   | 3/2016  |
| CN | 205901068 U | 1/2017  |
| CN | 109473865   | 3/2019  |

* cited by examiner

*Primary Examiner* — Yuanda Zhang (57) ABSTRACT

A semiconductor laser is disclosed. Trim loss region is provided in inner ridge region of surface of transmission layer facing away from substrate, blind hole is provided in trim loss region, and distance from bottom surface of blind hole to surface of second cladding layer facing to substrate is smaller than evanescent wave length in transmission layer. Blind hole can affect optical field characteristics of light transmission in semiconductor laser by affecting evanescent wave. A method for fabricating a semiconductor laser is also provided.

10 Claims, 7 Drawing Sheets

SEMICONDUCTOR LASER AND FABRICATION METHOD THEREOF

CROSS-REFERENCE TO RELATED APPLICATIONS

This application claims the benefit of priority from Chinese Patent Application No. CN201811593627.7, filed on Dec. 25, 2018. The content of the aforementioned application, including any intervening amendments thereto, is incorporated herein by reference in its entirety.

TECHNICAL FIELD

The present invention relates to the field of semiconductor optoelectronic devices, and in particular, to a semiconductor laser and a method for fabricating the same.

BACKGROUND OF THE PRESENT INVENTION

The brightness of a semiconductor laser is proportional to the ratio of power to beam quality, reflecting the excitation rate per unit of solid angle. In practical applications, it is often desirable for a semiconductor laser to have high output power and excellent beam quality, namely, high brightness. The existing methods mostly reduce the waveguide width of the semiconductor laser, thereby reducing the number of lateral modes, and achieving the purpose of improving the beam quality. However, since the area of the gain region reduces with reduced waveguide width, the output power is also greatly reduced.

Therefore, how to improve the beam quality of a semiconductor laser without significantly reducing the output power of the semiconductor laser is an urgent problem to be solved by those skilled in the art.

SUMMARY OF THE PRESENT INVENTION

The present invention aims to provide a semiconductor laser having a higher beam quality while having a certain output power. Another object of the present invention is to provide a method for fabricating a semiconductor laser which has a higher beam quality while having a certain output power.

In order to solve the above technical problems, the present invention provides a semiconductor laser including a substrate, a transmission layer, a first electrode, and a second electrode;

wherein the transmission layer is located on a first surface of the substrate; where the transmission layer includes a first cladding layer located on the first surface, a waveguide layer located on a surface of the first cladding layer facing away from the substrate, and a second cladding layer located on a surface of the waveguide layer facing away from the substrate; the transmission layer is ridged;

an inner ridge region on a surface of the transmission layer facing away from the substrate includes a trim loss region; a distance from the trim loss region to any long side of the inner ridge region is less than 25% of a length of a short side of the inner ridge region, and a distance from the trim loss region to any short side of the inner ridge region is less than 20% of a length of the long side of the inner ridge region; the trim loss region is provided with a blind hole, and a distance from a bottom surface of the blind hole to a surface of the second cladding layer facing to the substrate is smaller than an evanescent wave length in the transmission layer;

the first electrode is located in the inner ridge region on the surface of the transmission layer facing away from the substrate; and the second electrode is located on a second surface of the substrate opposite the first surface.

Optionally, the trim loss region is provided with a plurality of blind holes, and a distance between adjacent blind holes ranges from 2 μm to 10 μm, endpoint values included.

Optionally, the inner ridge region on the surface of the transmission layer facing away from the substrate includes four trim loss regions, and a distance from any of the trim loss regions to the long side of the inner ridge region is less than 25% of the length of the short side of the inner ridge region, and a distance from any of the trim loss regions to the short side of the inner ridge region is less than 20% of the length of the long side of the inner ridge region.

Optionally, the inner ridge region on the surface of the transmission layer facing away from the substrate further includes two isolation trenches parallel to the long sides of the inner ridge region, where the blind holes are disposed between the two isolation trenches.

Optionally, a distance between the isolation trench and a corresponding long side of the inner ridge region ranges from 2 μm to 10 μm, endpoint values included.

Optionally, the bottom surface of the blind hole is in a polygonal shape; a long side of the bottom surface of the blind hole has a length ranging from 5 μm to 15 μm, endpoint values included; a short side of the bottom surface of the blind hole has a length ranging from 2 μm to 5 μm, endpoint values included; and an angle of the bottom surface of the blind hole ranges from 40° to 160°, endpoint values included.

Optionally, the bottom surface of the blind hole is in a rectangular shape; a long side of the bottom surface of the blind hole has a length ranging from 2 μm to 10 μm, endpoint values included; and a short side of the bottom surface of the blind hole has a length ranging from 2 μm to 10 μm, endpoint values included.

Optionally, the bottom surface of the blind hole is circular, and a diameter of the bottom surface of the blind hole ranges from 2 μm to 10 μm, endpoint values included.

The present invention further provides a method for fabricating a semiconductor laser. The method includes:

providing a transmission layer on a first surface of a substrate, where the transmission layer includes a first cladding layer located on the first surface, a waveguide layer located on a surface of the first cladding layer facing away from the substrate, and a second cladding layer located on a surface of the waveguide layer facing away from the substrate, and the transmission layer is ridged;

etching a blind hole in a trim loss region of an inner ridge region on a surface of the transmission layer facing away from the substrate, where a distance from the trim loss region to any long side of the inner ridge region is less than 25% of a length of a short side of the inner ridge region, a distance from the trim loss region to any short side of the inner ridge region is less than 20% of a length of the long side of the inner ridge region, and a distance from a bottom surface of the blind hole to a surface of the second cladding layer facing to the substrate is smaller than an evanescent wave length in the transmission layer;

disposing a first electrode in the inner ridge region on the surface of the transfer layer, and disposing a second electrode on a second surface of the substrate opposite the first surface, to form the semiconductor laser.

Optionally, after providing the transmission layer on the first surface of the substrate, the method further includes:

etching two isolation trenches in the inner ridge region on the surface of the transmission layer, where the two isolation trenches are parallel to the long sides of the inner ridge region, where the blind holes are disposed between the two isolation trenches; a distance between the isolation trench and a corresponding long side of the inner ridge region is not greater than 10 μm.

In the semiconductor laser provided by the present invention, a trim loss region is provided in an inner ridge region of a surface of the transmission layer facing away from the substrate, a blind hole is provided in the trim loss region, and a distance from a bottom surface of the blind hole to a surface of the second cladding layer facing to the substrate is smaller than an evanescent wave length in the transmission layer. Since the distance from the blind hole to the surface of the second cladding layer facing to the substrate is smaller than the evanescent wave length in the transmission layer, the blind hole can affect the optical field characteristics of the light transmission in the semiconductor laser by affecting the evanescent wave. Because the distance from the trim loss region to any long side of the inner ridge region is less than 25% of the length of the short side of the inner ridge region, and the distance from the trim loss region to any short side of the inner ridge region is less than 20% of the length of the long side of the inner ridge region, the blind hole is located in a region that is at a distance from any long side of the inner ridge area that is less than 25% of the length of the short side of the inner ridge region and at a distance from any short side of the inner ridge area that is less than 20% of the length of the long side of the inner ridge region. Therefore, the blind hole can effectively increase the loss of the high-order mode in the semiconductor laser, thereby suppressing the high-order mode lasing and improving the beam quality of the laser; at the same time, since the above described blind hole has little effect on the low-order mode loss, and it is not necessary to reduce the waveguide width of the semiconductor laser, the semiconductor laser can have a certain output power and in turn higher brightness.

The present invention further provides a method for fabricating a semiconductor laser with the above-mentioned beneficial effects, and details are not described herein.

BRIEF DESCRIPTION OF THE DRAWINGS

In order to illustrate the embodiments of the present invention or the prior art more clearly, drawings used in the description of the embodiments or the prior art will be briefly described below. Obviously, the drawings in the following description are merely some embodiments of the present invention and other drawings may occur to those skills in the art based on these drawings without creative efforts.

In the Figures.

1. Substrate, 11. Buffer layer, 2. Transmission layer, 21. First cladding layer,

22. Waveguide layer, 221. n-type waveguide,

222. Active region, 223. p-type waveguide, 23. second cladding layer,

24. blind hole, 25. capping layer, 3. first electrode, 4. second electrode,

100. inner ridge region, 110. trim loss region, 111. isolation trench

DETAILED DESCRIPTION OF THE PRESENT INVENTION

The core of the invention is to provide a semiconductor laser. Conventionally, in order to reduce the number of lateral modes in a semiconductor laser, the waveguide width of the semiconductor laser is generally reduced, but the output power is also greatly reduced since the area of the gain region is also reduced as the waveguide width is reduced.

In the semiconductor laser provided by the present invention, a trim loss region is provided in an inner ridge region of a surface of the transmission layer facing away from the substrate, a blind hole is provided in the trim loss region, and a distance from a bottom surface of the blind hole to a surface of the second cladding layer facing to the substrate is smaller than an evanescent wave length in the transmission layer. Since the distance from the blind hole to the surface of the second cladding layer facing to the substrate is smaller than the evanescent wave length in the transmission layer, the blind hole can affect the optical field characteristics of the light transmission in the semiconductor laser by affecting the evanescent wave. Because the distance from the trim loss region to any long side of the inner ridge region is less than 25% of the length of the short side of the inner ridge region, and the distance from the trim loss region to any short side of the inner ridge region is less than 20% of the length of the long side of the inner ridge region, the blind hole is located in a region that is at a distance from any long side of the inner ridge area that is less than 25% of the length of the short side of the inner ridge region and at a distance from any short side of the inner ridge area that is less than 20% of the length of the long side of the inner ridge region. Therefore, the blind hole can effectively increase the loss of the high-order mode in the semiconductor laser, thereby suppressing the high-order mode lasing and improving the beam quality of the laser; at the same time, since the above described blind hole has little effect on the low-order mode loss, and it is not necessary to reduce the waveguide width of the semiconductor laser, the semiconductor laser can have a certain output power and in turn higher brightness.

The present invention will be further described in detail below in conjunction with the drawings and embodiments. It is apparent that the described embodiments are only some of the embodiments of the present invention, and not all of the embodiments. Any other embodiments obtained by those skilled in the art based on the embodiments of the present invention without creative efforts fall within the scope of the present invention.

Figure 1:
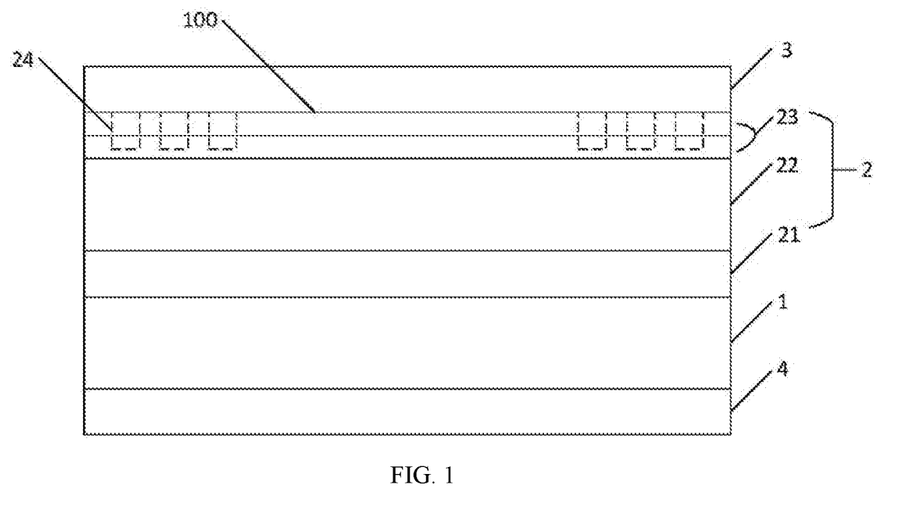
FIG. 1 is a schematic front view of a semiconductor laser according to an embodiment of the present invention.
Figure 2:
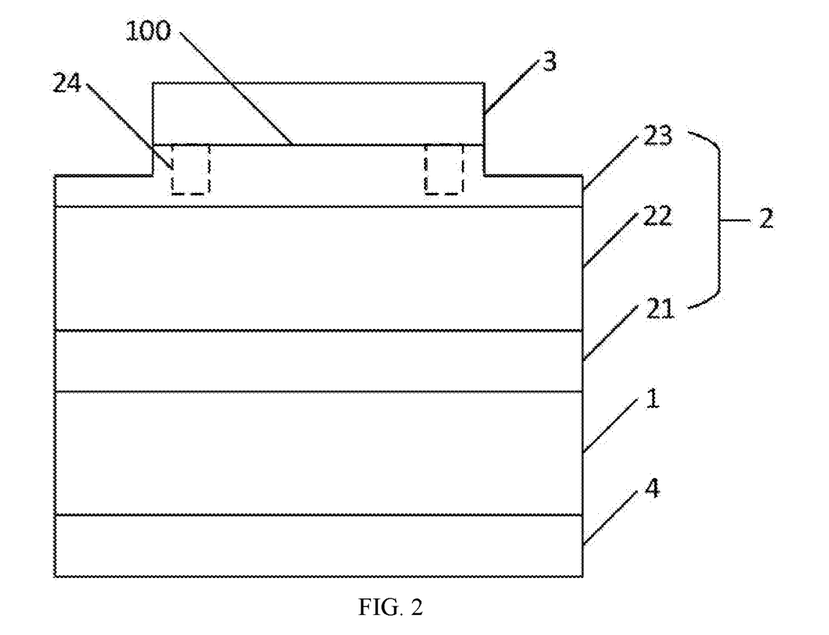
FIG. 2 is a side view of FIG. 1.
Figure 3:
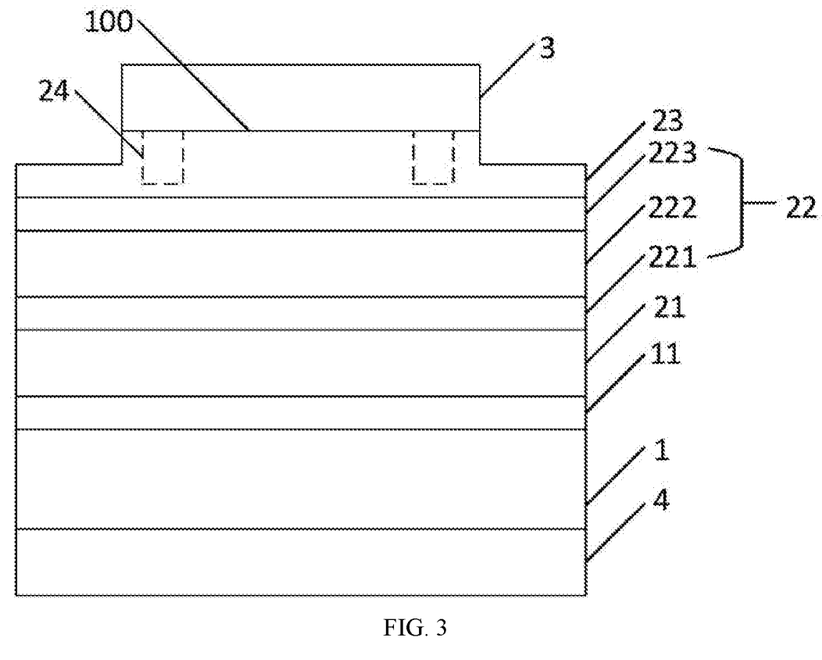
FIG. 3 is a specific schematic front view of FIG. 1.
Figure 4:
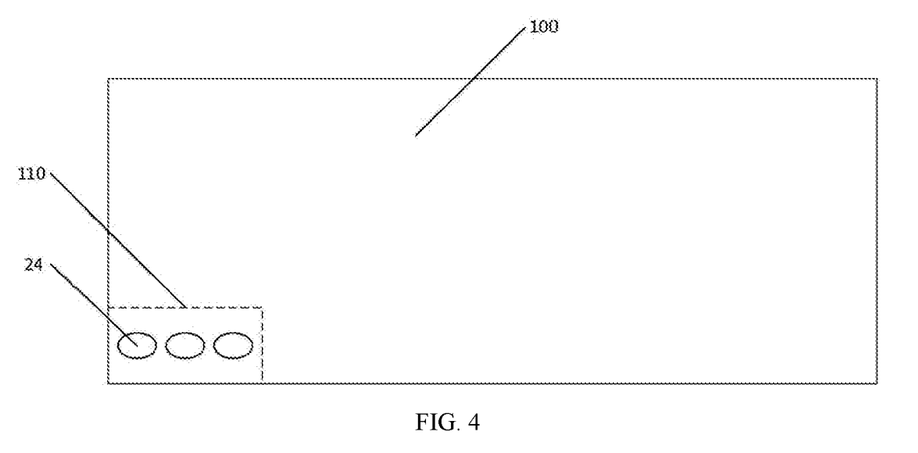
FIG. 4 is a top plan view of the inner ridge region in FIG. 1.

Please refer to FIGS. 1, 2, 3, 4 and 5. FIG. 1 is a schematic front view of a semiconductor laser according to an embodiment of the present invention; FIG. 2 is a side view of FIG. 1; FIG. 3 is a specific schematic front view of FIG. 1; FIG. 4 is a top plan view of the inner ridge region in FIG. 1.

Referring to FIG. 1 and FIG. 2, in the embodiment of the present invention, the semiconductor laser includes a substrate 1, a transmission layer 2, a first electrode 3, and a second electrode 4.

The transmission layer 2 is located on a first surface of the substrate 1; where the transmission layer 2 includes a first cladding layer 21 located on the first surface, a waveguide layer 22 located on a surface of the first cladding layer 21 facing away from the substrate 1, and a second cladding layer 23 located on a surface of the waveguide layer 22 facing away from the substrate 1; the transmission layer 2 is ridged; an inner ridge region 100 on a surface of the transmission layer 2 facing away from the substrate 1 includes a trim loss region 110; a distance from the trim loss region 110 to any long side of the inner ridge region 100 is less than 25% of a length of a short side of the inner ridge region 100, and a distance from the trim loss region 110 to any short side of the inner ridge region 100 is less than 20% of a length of the long side of the inner ridge region 100; the trim loss region 110 is provided with a blind hole 24, and a distance from a bottom surface of the blind hole 24 to a surface of the second cladding layer 23 facing to the substrate 1 is smaller than an evanescent wave length in the transmission layer 2; the first electrode 3 is located in the inner ridge region 100 on the surface of the transmission layer 2 facing away from the substrate 1; and the second electrode 4 is located on a second surface of the substrate 1 opposite the first surface.

The substrate 1 is mainly used for supporting, and the transfer layer 2, the first electrode 3, and the second electrode 4 are sequentially disposed on the surface of the substrate 1 in a certain order. The perparing process of a specific semiconductor laser will be described in detail in the following embodiments of the present invention, and will not be further described herein. In the embodiment of the present invention, the substrate 1 is generally a compound of III-V group elements, such as GaAs, InP, GaSb, GaN, etc., and the material of the substrate 1 includes, but not limited to, the above materials. Generally, in the embodiment of the present invention, the substrate 1 needs to be an n-type doped substrate 1.

The transmission layer 2 is located on the first surface of the substrate 1. The transmission layer 2 is used for transmitting light, and the transmission layer 2 is a resonant cavity in which light oscillates to generate laser. Specifically, the transmission layer 2 generally includes a first cladding layer 21 on the first surface, a waveguide layer 22 on a surface of the first cladding layer 21 facing away from the substrate 1, and a second cladding layer 23 on a surface of the waveguide layer 22 facing away from the substrate 1. The refractive index of the first cladding layer 21 and the refractive index of the second cladding layer 23 generally need to be smaller than the refractive index of the waveguide layer 22, so that a total reflection waveguide is formed by the first cladding layer 21, the waveguide layer 22 and the second cladding layer 23, and the laser light is usually transmitted in the waveguide layer 22, that is, the optical mode transmitted within the above mentioned resonator cavity is confined within the waveguide layer 22. However, due to the evanescent wave effect, part of the light is still transmitted in the first cladding layer 21 and the second cladding layer 23, that is, there is still some light transmitted in the first cladding layer 21 and the second cladding layer 23 in the form of evanescent waves.

It should be noted that the above-mentioned transmission layer 2 is ridged, and in this case the entire semiconductor laser has a ridged optical waveguide. The ridged transmission layer 2 has a longer cut-off wavelength of the dominant mode H10 wave; wider single-mode operating frequency band, which can reach several octaves; and lower equivalent impedance. The ridged transmission layer 2 generally includes an inner ridge and an outer ridge, where the inner ridge is mainly adapted to transmit a optical field. For the specific structure of the ridged transmission layer 2, reference may be made to the prior art, and details are not described herein. In general, a convex side of the above-described ridged transmission layer 2 is located on the side of the transmission layer 2 facing away from the substrate 1. Specifically, in the above-mentioned ridged transmission layer 2, it is feasible that the waveguide layer 22 is ridged or the second cladding layer 23 is ridged. In order to simplify the fabrication process of the semiconductor laser, in the embodiment of the present invention, the second cladding layer 23 is generally ridged. Correspondingly, the inner ridge region 100 corresponding to the inner ridge is provided on the surface of the transmission layer 2 facing away from the substrate 1.

Referring to FIG. 3, in the embodiment of the present invention, the first cladding layer 21 is generally an n-type cladding layer, i.e., the material of the first cladding layer 21 is generally n-type doped; and the second cladding layer 23 is generally a p-type cladding layer, i.e., the material of the second cladding layer 23 is generally p-doped. Specifically, the waveguide layer 22 generally includes an n-type waveguide 221 located on a surface of the first cladding layer 21 facing away from the substrate 1, an active region 222 located on a surface of the n-type waveguide 221 facing away from the substrate 1, and a p-type waveguide 223 located on a surface of the active region 222 facing away from the substrate 1, where the second cladding layer 23 is on a surface of the p-type waveguide 223 facing away from the substrate 1. The active region 222 may be quantum wells or quantum dots in a single layer or in a plurality of layers, and the active region 222 is used as a gain region of the laser. Specifically, the gain medium of the active region 222 may be quantum wells, quantum dots, quantum bands, a quantum cascade structure, or any combination thereof.

When an external power source applies a voltage to the first electrode 3 and the second electrode 4, electrons of the n-type doped material are activated to move toward the active region 222, and at the same time holes in the p-type doped material are activated to move toward the active region 222. The hole-electron pairs are coupled to emit light in the active region 222 and the light is transmitted in the above-described resonant cavity. For the specific materials of the respective layers of the transmission layer 2 and the specific materials of the first cladding layer 21 and the second cladding layer 23, reference may be made to the prior art, and details are not described herein.

Preferably, in the embodiment of the present invention, a buffer layer 11 may be disposed between the substrate 1 and the transmission layer 2. The material of the buffer layer 11 is generally the same as the material of the substrate 1. The buffer layer 11 is adapted to conceal the defects of the substrate 1 itself and prevents low brightness of the semiconductor layer due to excessive defects in the transmission layer 2.

Referring to FIG. 4, in the embodiment of the present invention, the inner ridge region 100 on the surface of the transmission layer 2 facing away from the substrate 1 includes a trim loss region 110. A distance from the trim loss region 110 to any long side of the inner ridge region 100 is less than 25% of a length of a short side of the inner ridge region 100, and a distance from the trim loss region 110 to any short side of the inner ridge region 100 is less than 20% of a length of the long side of the inner ridge region 100; the trim loss region 110 is provided with a blind hole 24, and a distance from a bottom surface of the blind hole 24 to a surface of the second cladding layer 23 facing to the substrate 1 is smaller than the evanescent wave length in the transmission layer 2.

The inner ridge region 100 is a region corresponding to the inner ridge of the transmission layer 2 and is in the surface of the transmission layer 2 facing away from the substrate 1. Since the transmission layer 2 has a ridge shape, generally there is a projection on the surface of the transmission layer 2 facing away from the substrate 1, and an upper surface of the projection is the inner ridge region 100. Typically, the inner ridge region 100 is rectangular.

The trim loss region 110 is located in the inner ridge region 100, and the inner ridge region 100 is provided with a blind hole 24. The distance between the trim loss region 110 and any long side of the inner ridge region 100 is less than 25% of the length of the short side of the inner ridge region 100, and the distance between the trim loss region 110 and any short side of the inner ridge region 100 is less than 20% of the length of the long side of the inner ridge region 100. In other words, the above-described trim loss region 110 is usually located in a corner region of the trim loss region 110, and correspondingly the blind hole 24 is also generally disposed in the corner region of the inner ridge region 100. The so-called corner region is the area in the inner ridge area 100 adjacent to an apex angle of the inner ridge area 100. It should be noted that the above-mentioned trim loss region 110 corresponds to the high-order mode optical field transmitted in the semiconductor laser, and the high-order mode loss in the semiconductor laser may be increased by disposing the blind hole 24 in the trim loss region 110, thereby suppressing high-order mode lasing and improving beam quality of the laser.

Figure 5:
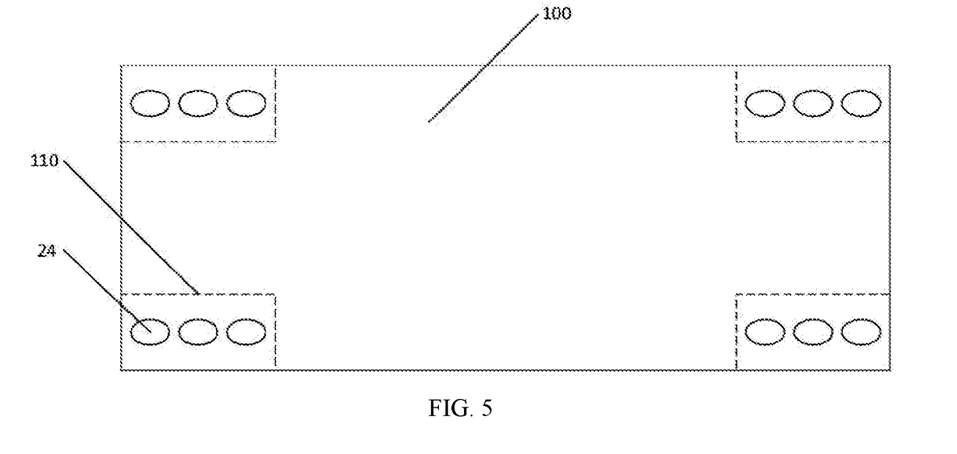
FIG. 5 is a specific top plan view of the inner ridge region in FIG. 1.

Referring to FIG. 5, as the inner ridge region 100 is generally rectangular, correspondingly the inner ridge region 100 has preferably four corner regions, and correspondingly four trim loss regions 110 may be disposed in the embodiment of the present invention. The four trim loss regions 110 are located in the four corner regions of the inner ridge region 100, respectively. Specifically, the inner ridge region 100 on the surface of the transmission layer 2 facing away from the substrate 1 includes four of the trim loss regions 110, and any of the trim loss regions 110 has a distance from the long side of the inner ridge region 100 that is less than 25% of the length of the short side of the inner ridge region 100, and a distance from the short side of the inner ridge region 100 that is less than 20% of the length of the long side of the inner ridge region 100. Accordingly, blind holes 24 are provided in each of the four trim loss regions 110. In the embodiment of the present invention, the blind holes 24 are generally distributed in the four regions near the apex angles of the inner ridge region 100. The provision of four mutually symmetric trim loss regions 110 in the inner ridge region 100 can affect the characteristics of the optical field transmitted in the waveguide layer 22 as symmetrically as possible.

The above-mentioned trim loss region 110 is provided with the blind holes 24, and the distance between the bottom surface of the blind hole 24 and the surface of the second cladding layer 23 facing the substrate 1 needs to be smaller than the evanescent wave length in the transmission layer 2; specifically, the distance between the bottom surface of the blind hole and the surface of the second cladding layer 23 facing to the substrate 1 needs to be smaller than the overall evanescent wave length in the second cladding layer 23, so that the blind hole 24 can affect the evanescent wave, and can affect the characteristics of the optical field transmitted in the waveguide layer 22 in turn by affecting the evanescent wave.

Specific parameters such as the specific shape of the blind hole 24 will be described in detail in the following embodiments of the present invention, and will not be further described here. It should be noted that, in the embodiment of the present invention, the blind hole 24 may be similarly disposed in the non-trim loss region 110 of the inner ridge region 100, but generally the blind hole 24 located in the non-trim loss region 110 would not affect the characteristics of the optical field transmitted in the waveguide layer 22.

In general, in order to increase the loss of the high-order mode in the semiconductor laser by way of the blind hole 24 as described above so as to suppress the high-order mode lasing, in the embodiment of the present invention multiple blind holes 24 are usually provided in any of the trim loss regions 110, and adjacent blind holes 24 are at a distance ranging from 2 μm to 10 μm, endpoint values included.

In the embodiment of the present invention, multiple blind holes 24 are disposed in the trim loss region 110, and the distance between adjacent blind holes 24 is limited to be between 2 μm and 10 μm, ensuring to increase the loss of the high-order mode in the semiconductor laser as much as possible, thereby suppressing the high-order mode lasing better.

In the embodiment of the present invention, the first electrode 3 is usually located in the inner ridge region 100 located on the surface of the transmission layer 2 facing away from the substrate 1; the second electrode 4 is usually located on a second surface of the substrate 1 opposite to the first surface. The first electrode 3 is usually a p-type electrode, and the second electrode 4 is usually an n-type electrode. The external power source can apply a voltage to the semiconductor laser through the first electrode 3 and the second electrode 4, so that coupling of hole-electron pairs occurs in the active region 222, thereby generating laser. For details about the first electrode 3 and the second electrode 4, reference may be made to the prior art, and details are not described herein.

In the semiconductor laser provided according to the embodiment of the present invention, the inner ridge region 100 on the surface of the transmission layer 2 facing away from the substrate 1 is provided with the trim loss region 110, and the trim loss region 110 is provided with the blind holes 24, in which the distance between the bottom surface of the blind hole and the surface of the second cladding layer 23 facing toward the substrate 1 is smaller than the evanescent wave length in the transmission layer 2. Since the distance between the blind hole 24 and the surface of the second cladding layer 23 facing toward the substrate 1 is smaller than the evanescent wave length in the transmission layer 2, the blind hole 24 can affect the optical field characteristics of the light transmission in the semiconductor laser by affecting the evanescent wave. Because the distance from the trim loss region 110 to any long side of the inner ridge region 100 is less than 25% of the length of the short side of the inner ridge region 100, and the distance from the trim loss region 110 to any short side of the inner ridge region 100 is less than 20% of the length of the long side of the inner ridge region 100, the blind hole 24 is located in a region that is at a distance from any long side of the inner ridge area 100 that is less than 25% of the length of the short side of the inner ridge region 100 and at a distance from any short side of the inner ridge area 100 that is less than 20% of the length of the long side of the inner ridge region 100. Therefore, the blind hole 24 can effectively increase the loss of the high-order mode in the semiconductor laser, thereby suppressing the high-order mode lasing and improving the beam quality of the laser; at the same time, since the above described blind hole 24 has little effect on the low-order mode loss, and it is not necessary to reduce the waveguide width of the semiconductor laser, the semiconductor laser can have a certain output power and in turn higher brightness.

The details of the semiconductor laser provided by the present invention will be described in details in the following embodiments of the present invention.

Figure 6:
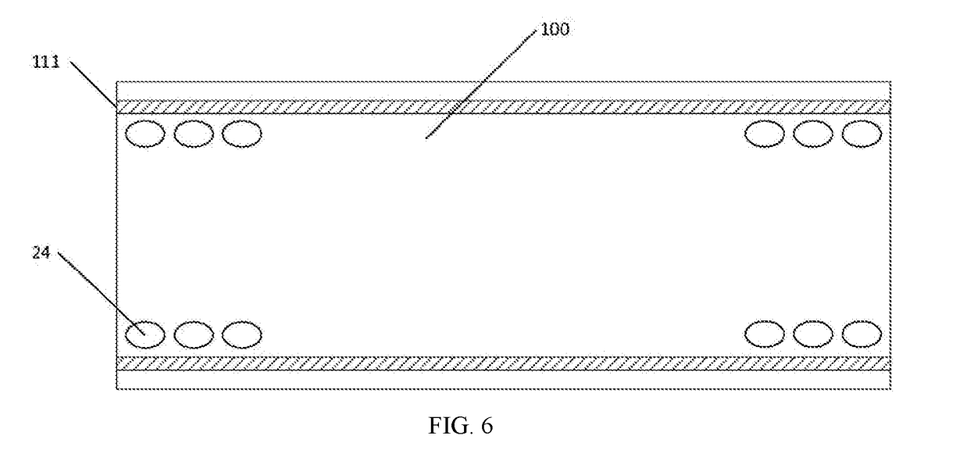
FIG. 6 is a schematic structural view of an inner ridge region in a specific semiconductor laser according to an embodiment of the present invention.
Figure 7:
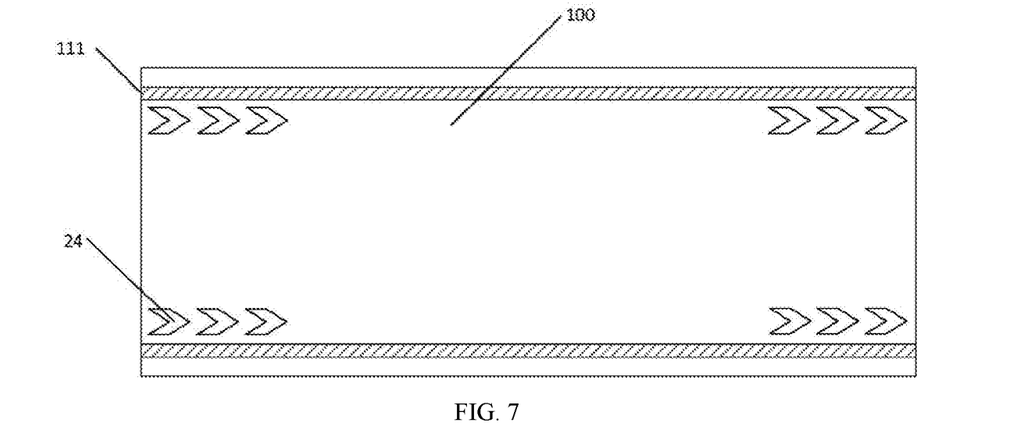
FIG. 7 is a first specific structural view of FIG. 6.
Figure 8:
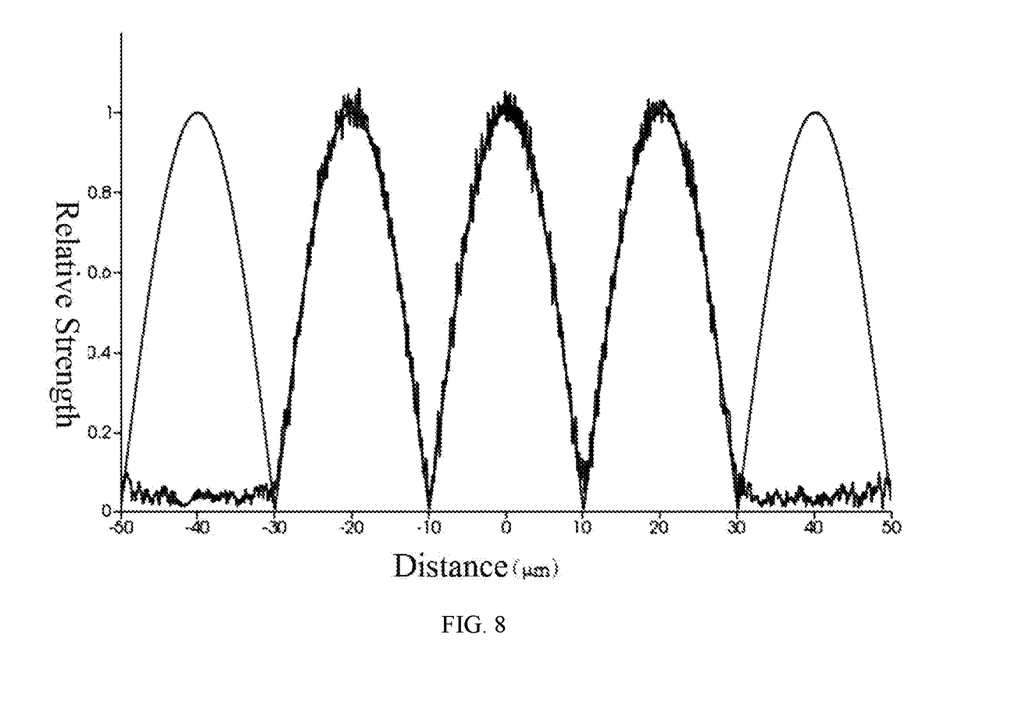
FIG. 8 is a simulation result graph showing that the blind hole in FIG. 7 increases the mode loss.
Figure 9:
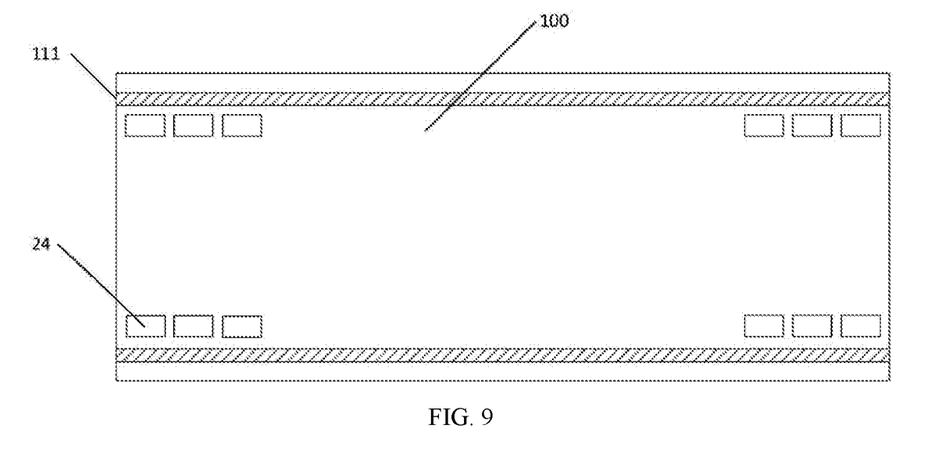
FIG. 9 is a second specific structural view of FIG. 6.
Figure 10:
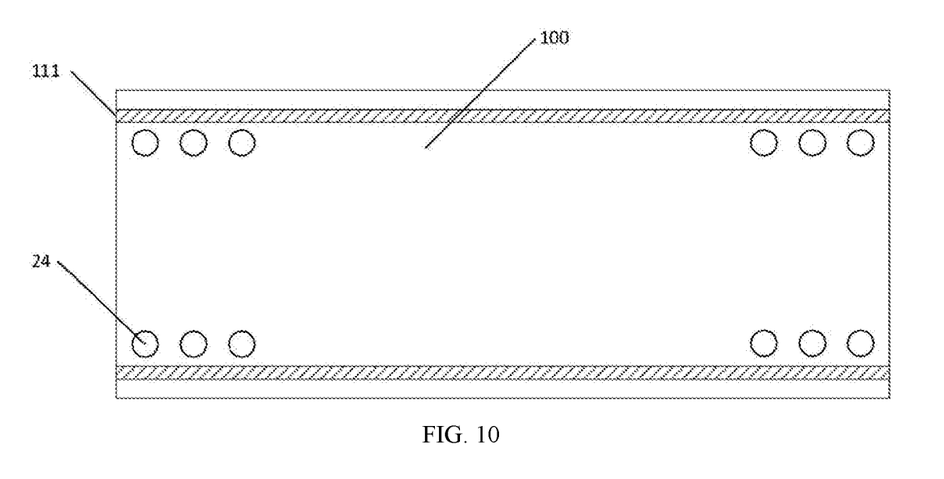
FIG. 10 is a third specific structural view of FIG. 6.
Figure 11:
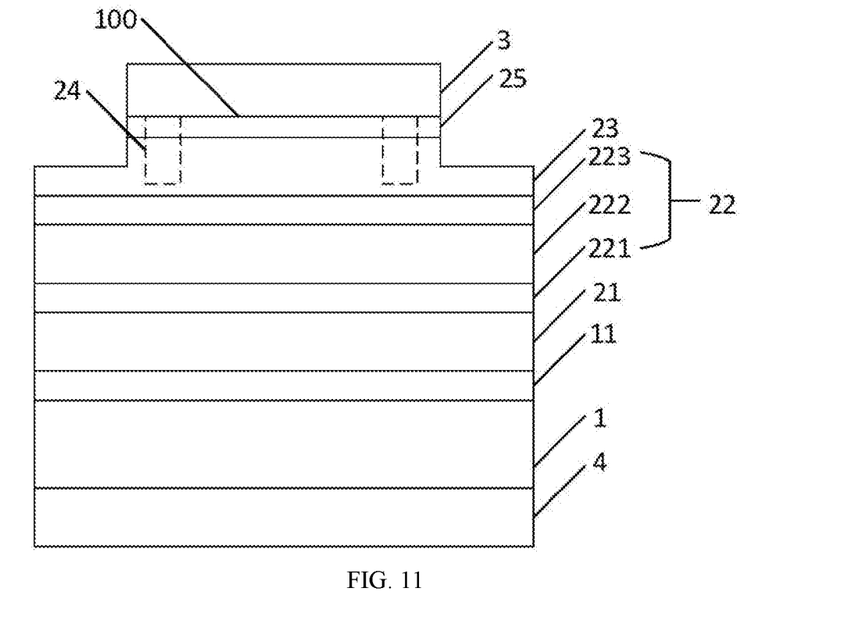
FIG. 11 is a schematic structural view of another specific semiconductor laser according to an embodiment of the present invention.

Reference is to FIG. 6, FIG. 7, FIG. 8, FIG. 9, FIG. 10 and FIG. 11. FIG. 6 is a schematic structural diagram of an inner ridge region in a specific semiconductor laser according to an embodiment of the present invention; FIG. 7 is a first specific structural view of FIG. 6; FIG. 8 is a simulation result graph showing that the blind hole in FIG. 7 increases the mode loss; FIG. 9 is a second specific structural view of FIG. 6; FIG. 10 is a third specific structural view of FIG. 6; FIG. 11 is a schematic structural view of another specific semiconductor laser according to an embodiment of the present invention.

Different from the above embodiments of the present invention, this embodiment of the present invention further defines the structure of the semiconductor laser based on the above embodiments of the present invention. Other contents have been described in detail in the above embodiments of the present invention, and will not be further described herein.

Referring to FIG. 6, in this embodiment of the present invention, in the case that four trim loss regions 110 are disposed in the inner ridge region 100, the inner ridge region 100 on the surface of the transmission layer 2 facing away from the substrate 1 further includes two isolation trenches 111 parallel to the long sides of the inner ridge region 100; where the blind holes 24 are disposed between the two isolation trenches 111.

In the embodiment of the present invention, the isolation trenches 111 are generally parallel to the long sides of the inner ridge regions 100, while the length of each isolation trench 111 is generally the same or similar to the length of the long side of the inner ridge regions 100. Moreover, since four of the above-described trim loss regions 110 are provided in the embodiment of the present invention, correspondingly blind holes 24 are generally close to the long sides of the inner ridge region 100. Since the blind holes 24 are located between the two isolation trenches 111, the distance between the isolation trench 111 and the corresponding long side of the inner ridge region 100 is generally relatively close. Obviously, the two isolation trenches 111 are respectively close to the two corresponding long sides of the inner ridge region 100. Generally, in the embodiment of the present invention, the distance between the isolation trench 111 and the corresponding long side of the inner ridge region 100 is not greater than 10 μm.

Specifically, the width of the isolation trench 111 is generally between 2 μm and 5 μm, endpoint values included; the width of the isolation trench 111 is generally between 0.3 μm and 1.5 μm, endpoint values included; and the distance from the isolation trench 111 to the corresponding long side of the inner ridge region 100 is typically between 2 μm and 10 μm, endpoint values included. The region of the above-described isolation trench 111 can suppress lateral accumulation of carriers in the semiconductor laser, thereby improving far field stability. It should be noted that, in the embodiment of the present invention, the isolation trench 111 may be in contact with the blind hole 24; in other words, the isolation trench 111 and the blind hole 24 may partially overlap, but the isolation trench 111 would generally not completely cover the blind hole 24.

In general, in order to ensure that the characteristics of the optical field transmitted in the waveguide layer 22 can be uniformly and symmetrically affected, and in order to facilitate the fabrication of the blind holes 24, the bottom surfaces of the blind holes 24 are usually in an axisymmetric shape.

Referring to FIG. 7, in particular, in the embodiment of the present invention, the bottom surface of the blind hole 24 may be in a polygonal shape, and a long side of the bottom surface of the blind hole 24 may range from 5 μm to 15 μm, endpoint values included; a short side of the bottom surface of the blind hole 24 ranges from 2 μm to 5 μm, endpoint values included; an angle of the shape formed by the bottom surface of the blind hole 24 ranges from 40° to 160°, endpoint values included.

The bottom surface of the blind line 24 in the polygonal shape is generally formed by two line segments connected at a certain angle. The long side of the polygonal shape is the length of one line segment, that is, the total length of the two line segments of the polygonal shape ranges from 10 μm to 30 μm, endpoint values included; the width of the polygonal shape is the width of any of the line segments, and the angle of the polygonal shape is the angle between the two line segments.

The polygonal shape can also be understood as an arrow shape. In general, in order to ensure uniform and symmetric influence on the characteristics of the optical field transmitted in the waveguide layer 22, if the inner ridge area 100 is provided with multiple blind holes 24 with arrow-shaped bottom surfaces, point directions of the arrowheads of the multiple bottom holes 24 having the arrow-shaped bottom surfaces are generally in a same line; preferably, point directions of the arrowheads of the multiple bottom holes 24 having the arrow-shaped bottom surfaces are generally the same, and the point directions of the arrowheads of the multiple bottom holes 24 having the arrow-shaped bottom surfaces are generally parallel to a direction of an extension line of the long side of the inner ridge region 100.

Referring to FIG. 8, in the embodiment of the present invention, in the case that four trim loss regions 110 are disposed in the inner ridge region 100, multiple blind holes 24 which have polygonal shaped bottom surfaces and have the same orientation are disposed in each of the trim loss regions 110, and the isolation trenches 111 are disposed, taking the four-order mode as an example, referring to the simulation result showing that the structure in the above-described inner ridge region 100 as shown in FIG. 5 increases mode loss, it can been seen that the blind holes 24 and the isolation trenches 111 can reduce the edge field intensity of the fourth-order mode to almost zero, while leaving only the middle three peaks unchanged.

Referring to FIG. 9, in particular, in the embodiment of the present invention, the bottom surface of the blind hole 24 has a rectangular shape, and the long side of the bottom surface of the blind hole 24 has a length ranging from 2 μm to 10 μm, endpoint values included. The short side of the bottom surface of the blind hole 24 has a length ranging from 2 μm to 10 μm, endpoint values included.

In general, in order to ensure that the characteristics of the optical field transmitted in the waveguide layer 22 can be uniformly and symmetrically affected, the long sides of the blind holes 24 with the rectangular bottom surfaces are generally parallel to each other, and the short sides of the blind holes 24 having the rectangular bottom surfaces are also generally parallel to each other. Preferably, the long side of the blind hole 24 having the rectangular bottom surface is generally parallel to the extension line of the long side of the inner ridge region 100.

Referring to FIG. 10, specifically, in the embodiment of the present invention, the bottom surface of the blind hole 24 is circular, and the diameter of the bottom surface of the blind hole 24 ranges from 2 μm to 10 μm, endpoint values included.

Of course, in the embodiment of the present invention, the bottom surface of the blind hole 24 may have other shapes, such as a triangle, a semicircle, or the like. However, in order to ensure that the characteristics of the optical field transmitted in the waveguide layer 22 can be uniformly and symmetrically affected, the bottom surface of the blind hole 24 generally needs to have a symmetrical shape. If the bottom surface of the blind hole 24 has a triangular shape, the triangular shape is usually an isosceles triangle, and the apex angle of the triangle is usually between 40° and 160°, endpoint values included; the length of the two equal sides in the isosceles triangle is typically between 5 μm and 15 μm, endpoint values included.

Referring to FIG. 11, in the embodiment of the present invention, the transmission layer 2 may further include a cap layer 25. The cap layer 25 is located in the inner ridge region 100 on the surface of the second cladding layer 23 facing away from the substrate 1; and the doping concentration of the cap layer 25 is greater than the doping concentration of the second cladding layer 23.

The cap layer 25 is typically located on a side of the transmission layer 2 facing away from the substrate 1. The cap layer 25 is typically heavily doped, i.e., the doping concentration of the cap layer 25 is generally large, and correspondingly the resistance of the cap layer 25 is generally low. The first electrode 3 generally needs to be in direct contact with the cap layer 25, and the use of the cap layer 25 having a low resistance can facilitate the formation of an ohmic contact between the transmission layer 2 and the first electrode 3. It should be noted that, as the second cladding layer 23 is generally a p-type cladding layer, the corresponding cap layer 25 is generally a p-type cap layer 25, and the cap layer 25 is usually a heavily doped p-type cap layer 25.

In a semiconductor laser provided by an embodiment of the present invention, an isolation trench 111 is provided in the inner ridge region 100 on a surface of the transmission layer 2 facing away from the substrate 1, and the isolation trench 111 region can suppress lateral accumulation of the carriers in the semiconductor laser, thereby improving the stability of the far field. Three specific shapes for the blind hole 24 are proposed. Taking the fourth-order mode as an example, the blind hole 24 and the isolation trench 111 can reduce the intensity of the edge optical field of the fourth-order mode to almost zero with only the middle three peaks remain unchanged; the first electrode 3 can be made to form an ohmic contact with the transmission layer 2 through the cap layer 25.

In the following, a method for fabricating a semiconductor laser provided according to the present invention will be described. The fabrication method described below and the structure of the semiconductor laser described above can be referred to each other.

Figure 12:
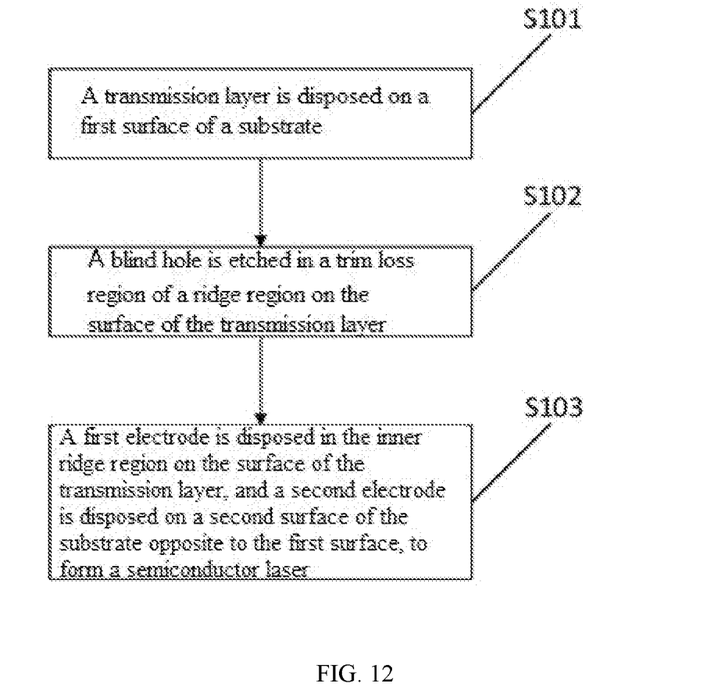
FIG. 12 is a flowchart of a method for fabricating a semiconductor laser according to an embodiment of the present invention.

Reference is made to FIG. 12. FIG. 12 is a flowchart of a method for fabricating a semiconductor laser according to an embodiment of the present invention.

Referring to FIG. 12, in the embodiment of the present invention, the method for fabricating the semiconductor laser includes the following steps.

S101: A transmission layer is disposed on a first surface of a substrate.

In an embodiment of the present invention, the transmission layer includes a first cladding layer located on the first surface, a waveguide layer located on a surface of the first cladding layer facing away from the substrate, and a second cladding layer located on a surface of the waveguide layer facing away from the substrate. The transmission layer is ridged.

Typically, in this step, the first cladding layer, the waveguide layer, the second cladding layer, etc. are sequentially grown on the first surface of the substrate by molecular beam epitaxy (MBE) or metal organic compound chemical vapor deposition (MOCVD). The transmission layer is etched into a ridge shape when the transmission layer is disposed to provide the ridge-shaped transmission layer on the first surface of the substrate. The specific structure of the transmission layer has been described in detail in the foregoing embodiments of the present invention, and details are not described herein.

More specifically, in this step, a buffer layer, an n-type cladding layer, an n-type waveguide, an active region, a p-type waveguide, a p-type cladding layer, and a p-type cap layer are sequentially grown on the first surface of the substrate; after the above layers are disposed, the p-type cap layer and the p-type cladding layer are etched. The p-type cladding layer is etched into a ridge shape, and the p-type cap layer covers a convex upper surface of the p-type cladding layer facing away from the substrate, thereby providing the transmission layer on the first surface of the substrate. For specific process of providing each of the above layers, reference may be made to the prior art, and details are not described herein.

S102: a blind hole is etched in a trim loss region of a ridge region on the surface of the transmission layer.

In the embodiment of the present invention, a distance from the trim loss region to any long side of the inner ridge region is less than 25% of a length of a short side of the inner ridge region, a distance from the trim loss region to any short side of the inner ridge region is less than 20% of a length of the long side of the inner ridge region, and a distance from a bottom surface of the blind hole to a surface of the second cladding layer facing to the substrate is smaller than an evanescent wave length in the transmission layer. The details of the inner ridge area, the trimming loss area, and the blind hole are described in detail in the above embodiments of the present invention, and are not described here.

Specifically, in this step, the lithography process is typically used to etch the blind hole in the trim loss region of the ridge region on the surface of the transmission layer. More specifically, in this step, photoresist is uniformly coated on the inner ridge region on the surface of the transmission layer; then the region in the photoresist corresponding to the blind hole is exposed to ultraviolet light through an optical mask; and finally the blind hole is etched, via etching process, in the trim loss region of the inner ridge region on the surface of the transmission layer. Of course, in the embodiment of the present invention, the blind hole may be etched in the trim loss region of the inner ridge region on the surface of the transmission layer by other processes. For the specific etching process, reference may be made to the prior art, and details are not described herein.

S103: a first electrode is disposed in the inner ridge region on the surface of the transmission layer, and a second electrode is disposed on a second surface of the substrate opposite to the first surface, to form a semiconductor laser.

If a p-type cap layer is disposed in S101 in the inner ridge region on the surface of the second cladding layer facing away from the substrate, a silicon dioxide layer is usually grown on the surface of the cap layer before performing this step; and then the silicon dioxide layer is exposed to light via an optical mask; an ohmic contact region is then etched on the surface of the cap layer by a silicon dioxide etching process.

Specifically, in this step, a layer of p-type ohmic contact metal is usually deposited by a metal growth device on the inner ridge region of the surface of the transmission layer, usually on the surface of the cap layer. The p-type ohmic contact metal forms an ohmic contact with the cap layer through the ohmic contact region, and the p-type ohmic contact metal is the first electrode described above.

In this step, the second surface of the substrate is usually thinned and polished before the second electrode is disposed. After the thinning and polishing, a layer of n-type ohmic contact metal is grown on the second surface of the substrate by a metal growth device, and the n-type ohmic contact metal is the second electrode. After the first electrode and the second electrode are disposed, the semiconductor laser provided by the present invention is fabricated.

In a semiconductor laser fabricated with the method provided according to the embodiment of the present invention, a trim loss region is provided in an inner ridge region of a surface of the transmission layer facing away from the substrate, a blind hole is provided in the trim loss region, and a distance from a bottom surface of the blind hole to a surface of the second cladding layer facing to the substrate is smaller than an evanescent wave length in the transmission layer. Since the distance from the blind hole to the surface of the second cladding layer facing to the substrate is smaller than the evanescent wave length in the transmission layer, the blind hole can affect the optical field characteristics of the light transmission in the semiconductor laser by affecting the evanescent wave. Because the distance from the trim loss region to any long side of the inner ridge region is less than 25% of the length of the short side of the inner ridge region, and the distance from the trim loss region to any short side of the inner ridge region is less than 20% of the length of the long side of the inner ridge region, the blind hole is located in a region that is at a distance from any long side of the inner ridge area that is less than 25% of the length of the short side of the inner ridge region and at a distance from any short side of the inner ridge area that is less than 20% of the length of the long side of the inner ridge region. Therefore, the blind hole can effectively increase the loss of the high-order mode in the semiconductor laser, thereby suppressing the high-order mode lasing and improving the beam quality of the laser; at the same time, since the above described blind hole has little effect on the low-order mode loss, and it is not necessary to reduce the waveguide width of the semiconductor laser, the semiconductor laser can have a certain output power and in turn higher brightness.

Specific steps for fabricating the semiconductor laser of the present invention will be described in detail in the following embodiments of the present invention.

Figure 13:
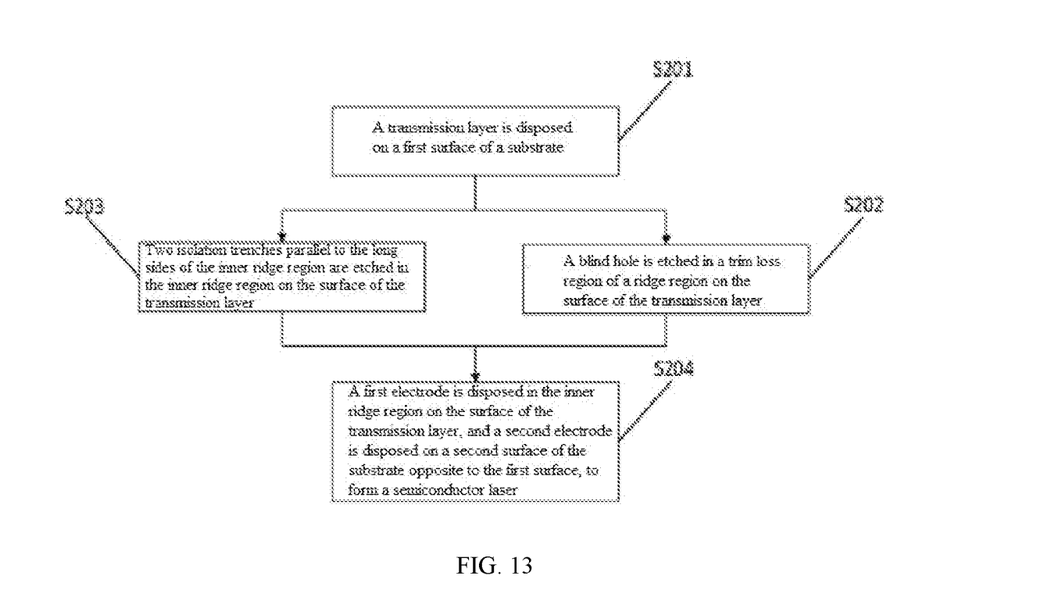
FIG. 13 is a flowchart of a specific method for fabricating a semiconductor laser according to an embodiment of the present invention.

Please refer to FIG. 13. FIG. 13 is a flowchart of a specific method for fabricating a semiconductor laser according to an embodiment of the present invention.

Referring to FIG. 13, in the embodiment of the present invention, the method for fabricating the semiconductor laser includes the following steps.

S201: a transmission layer is disposed on a first surface of a substrate.

S202: a blind hole is etched in a trim loss region of a ridge region on the surface of the transmission layer.

S203: two isolation trenches parallel to the long sides of the inner ridge region are etched in the inner ridge region on the surface of the transmission layer.

In this embodiment of the present invention, the blind hole is disposed between the two isolation trenches; and a distance from the isolation trench to a corresponding long side of the inner ridge region is not greater than 10 μm. The details of the isolation trench have been described in detail in the above embodiments of the invention, and are not described herein again.

In this step, the isolation trenches are typically etched in the inner ridge region of the surface of the transmission layer using a photolithographic process. More specifically, in this step, the photoresist is uniformly coated on the inner ridge region of the surface of the transmission layer; then the region corresponding to the isolation trench in the photoresist is exposed to ultraviolet light through an optical mask; and finally, the isolation trenches are etched in the inner ridge region of the surface of the transmission layer by an etching process.

It should be noted that, in the embodiment of the present invention, S202 and S203 are generally performed synchronously. In other words, after the photoresist is uniformly coated on the inner ridge region of the surface of the transmission layer, usually the regions corresponding to the blind hole and the isolation trenches in the photoresist are simultaneously exposed to ultraviolet light through the optical mask; finally, the blind hole and the isolation trenches are simultaneously etched in the inner ridge region of the surface of the transmission layer by etching process.

Of course, in the embodiment of the present invention, the isolation trenches can be etched in the inner ridge region of the surface of the transmission layer by other processes. For the specific etching process, reference may be made to the prior art, and details are not described herein.

S204: a first electrode is disposed in the inner ridge region on the surface of the transmission layer, and a second electrode is disposed on a second surface of the substrate opposite to the first surface, to form a semiconductor laser.

This step is basically the same as S103 in the foregoing embodiment of the present invention. For details, reference may be made to the foregoing embodiment of the invention, and no further details are provided herein.

Since the semiconductor laser is usually fabricated in a wafer, multiple semiconductor lasers are usually fabricated simultaneously in the wafer. Correspondingly, after this step, it is usually necessary to divide the wafer from which the semiconductor laser structures are fabricated, i.e., to separate the multiple semiconductor lasers from each other; then, the semiconductor laser is coated and packaged to finally obtain the fabricated semiconductor laser.

In the semiconductor laser fabricated with the method for fabricating a semiconductor laser according to an embodiment of the present invention, a transmission layer is provided with isolation trenches in an inner ridge region on a surface of the transmission layer facing away from the substrate, and the isolation trench region can suppress lateral accumulation of carriers in the semiconductor laser, thereby improving far field stability.

The various embodiments in the specification are described in a progressive manner, and each embodiment focuses on differences from other embodiments. The same or similar parts of the respective embodiments may be referred to each other.

Finally, It should be noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a plurality of elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

A semiconductor laser and a method for fabricating a semiconductor laser provided by the present invention are described in detail above. Specific examples are set forth to specify the principle and implementation of the disclosure, and the description of the foregoing embodiments is only intended to facilitate understanding the method and core principle of the disclosure. It should be noted that those skilled in the art can make various modifications and changes to the present invention without departing from the spirit and scope of the present invention, and these modifications and changes fall into the scope of the appended claims.

What is claimed is:

1. A semiconductor laser comprising a substrate, a transmission layer, a first electrode and a second electrode, wherein:
   the transmission layer is located on a first surface of the substrate;
   the transmission layer comprises a first cladding layer located on the first surface, a waveguide layer located on a surface of the first cladding layer facing away from the substrate, and a second cladding layer located on a surface of the waveguide layer facing away from the substrate; the transmission layer is ridged;
   an inner ridge region on a surface of the transmission layer facing away from the substrate comprises a trim loss region; a distance from the trim loss region to any long side of the inner ridge region is less than 25% of a length of a short side of the inner ridge region, and a distance from the trim loss region to any short side of the inner ridge region is less than 20% of a length of the long side of the inner ridge region; the trim loss region is provided with a blind hole, and a distance from a bottom surface of the blind hole to a surface of the second cladding layer facing to the substrate is smaller than an evanescent wave length in the transmission layer;
   the first electrode is located in the inner ridge region on the surface of the transmission layer facing away from the substrate; and
   the second electrode is located on a second surface of the substrate opposite the first surface.

2. The semiconductor laser according to claim 1, wherein the trim loss region is provided with a plurality of blind holes, and a distance between adjacent blind holes ranges from 2 μm to 10 μm, endpoint values included.

3. The semiconductor laser according to claim 2, wherein the inner ridge region on the surface of the transmission layer facing away from the substrate comprises four of the trim loss regions, and a distance from any of the trim loss regions to the long side of the inner ridge region is less than 25% of the length of the short side of the inner ridge region, and a distance from any of the trim loss regions to the short side of the inner ridge region is less than 20% of the length of the long side of the inner ridge region.

4. The semiconductor laser according to claim 3, wherein the inner ridge region on the surface of the transmission layer facing away from the substrate further comprises two isolation trenches parallel to the long sides of the inner ridge region, wherein the blind holes are disposed between the two isolation trenches.

5. The semiconductor laser according to claim 4, wherein a distance between the isolation trench and a corresponding long side of the inner ridge region ranges from 2 μm to 10 μm, endpoint values included.

6. The semiconductor laser according to claim 1, wherein: the bottom surface of the blind hole is in a polygonal shape; a long side of the bottom surface of the blind hole has a length ranging from 5 μm to 15 μm, endpoint values included; a short side of the bottom surface of the blind hole has a length ranging from 2 μm to 5 μm, endpoint values included; and an angle of the bottom surface of the blind hole ranges from 40° to 160°, endpoint values included.

7. The semiconductor laser according to claim 1, wherein: the bottom surface of the blind hole is in a rectangular shape; a long side of the bottom surface of the blind hole has a length ranging from 2 μm to 10 μm, endpoint values included; and a short side of the bottom surface of the blind hole has a length ranging from 2 μm to 10 μm, endpoint values included.

8. The semiconductor laser according to claim 1, wherein the bottom surface of the blind hole is circular, and a diameter of the bottom surface of the blind hole ranges from 2 μm to 10 μm, endpoint values included.

9. A method for fabricating a semiconductor laser, the method comprising: providing a transmission layer on a first surface of a substrate,
   wherein the transmission layer comprises a first cladding layer located on the first surface, a waveguide layer located on a surface of the first cladding layer facing away from the substrate, and a second cladding layer located on a surface of the waveguide layer facing away from the substrate, and the transmission layer is ridged;
   etching a blind hole in a trim loss region of an inner ridge region on a surface of the transmission layer facing away from the substrate, wherein a distance from the trim loss region to any long side of the inner ridge region is less than 25% of a length of a short side of the inner ridge region, a distance from the trim loss region to any short side of the inner ridge region is less than 20% of a length of the long side of the inner ridge region, and a distance from a bottom surface of the blind hole to a surface of the second cladding layer facing to the substrate is smaller than an evanescent wave length in the transmission layer;

disposing a first electrode in the inner ridge region on the surface of the transfer layer, and disposing a second electrode on a second surface of the substrate opposite the first surface, to form the semiconductor laser.

10. The method according to claim 9, wherein the method further comprises: after providing the transmission layer on the first surface of the substrate, etching two isolation trenches in the inner ridge region on the surface of the transmission layer, wherein the two isolation trenches are parallel to the long sides of the inner ridge region, wherein the blind holes are disposed between the two isolation trenches; a distance between the isolation trench and a corresponding long side of the inner ridge region is not greater than 10 µm.

* * * * *